United States Patent [19]

Schreck et al.

[11] Patent Number: 5,140,554
[45] Date of Patent: Aug. 18, 1992

[54] INTEGRATED CIRCUIT FUSE-LINK TESTER AND TEST METHOD

[75] Inventors: John F. Schreck; Phat C. Truong, both of Houston; David Tatman, Missouri City, all of Tex.

[73] Assignee: Texas Instruments Incorporated, Dallas, Tex.

[21] Appl. No.: 574,835

[22] Filed: Aug. 30, 1990

[51] Int. Cl.⁵ .............................................. G11C 29/00
[52] U.S. Cl. ................................. 365/201; 365/225.7
[58] Field of Search ........................ 365/201, 225.7, 96

[56] References Cited

U.S. PATENT DOCUMENTS 4,730,273 3/1988 Sluss ................................ 365/201 X Primary Examiner—Joseph A. Popek
Attorney, Agent, or Firm—Theodore D. Lindgren; Lawrence J. Bassuk; Richard L. Donaldson

[57] ABSTRACT

A test circuit for determining whether or not fuse-links of an integrated circuit have been opened or closed properly by, for example, a laser device. The test circuit of this invention, in one embodiment, includes a variable impedance, such as a P-channel transistor, connected between a voltage source and an output terminal, the impedance having one value with a first input applied to the variable impedance control terminal and having a second, larger value in response to a second input applied to the variable impedance control terminal. At least one programmable fuse-link and a gate are connected in series between the output terminal and a source of reference potential. A means for providing control inputs to the variable impedance is connected between a test mode input signal and the control terminal of the variable impedance. The means for providing control inputs to the P-channel transistor may include a second, current-mirror-connected P-channel transistor.

16 Claims, 4 Drawing Sheets

ADDRESS INPUT

| PRE-DECODER | | | | | | |
|---|---|---|---|---|---|---|
| PROGRAM PATH | | | | | | |
| REDUNDANT ROWS | WORDLINE DECODER AND DRIVERS | REDUNDANT COLUMNS | REDUNDANT ROWS | REDUNDANT ROWS | WORDLINE DECODER AND DRIVERS | REDUNDANT ROWS |
| 512x512 MEMORY CELL ARRAY | | | 512x512 MEMORY CELL ARRAY | 512x512 MEMORY CELL ARRAY | | 512x512 MEMORY CELL ARRAY |
| COLUMN/ SEGMENT PASS GATES | SEGMENT DECODER | | COLUMN/ SEGMENT PASS GATES | COLUMN/ SEGMENT PASS GATES | SEGMENT DECODER | COLUMN/ SEGMENT PASS GATES |
| 512x512 MEMORY CELL ARRAY | WORDLINE DECODER AND DRIVERS | REDUNDANT COLUMNS | 512x512 MEMORY CELL ARRAY | 512x512 MEMORY CELL ARRAY | WORDLINE DECODER AND DRIVERS | 512x512 MEMORY CELL ARRAY |
| 512x512 MEMORY CELL ARRAY | | REDUNDANT COLUMNS | 512x512 MEMORY CELL ARRAY | 512x512 MEMORY CELL ARRAY | | 512x512 MEMORY CELL ARRAY |
| COLUMN/ SEGMENT PASS GATES | SEGMENT DECODER | | COLUMN/ SEGMENT PASS GATES | COLUMN/ SEGMENT PASS GATES | SEGMENT DECODER | COLUMN/ SEGMENT PASS GATES |
| 512x512 MEMORY CELL ARRAY | WORDLINE DECODER AND DRIVERS | REDUNDANT COLUMNS | 512x512 MEMORY CELL ARRAY | 512x512 MEMORY CELL ARRAY | WORDLINE DECODER AND DRIVERS | 512x512 MEMORY CELL ARRAY |
| VIRTUAL GROUND DECODER | COLUMN DECODER | | VIRTUAL GROUND DECODER | VIRTUAL GROUND DECODER | COLUMN DECODER | VIRTUAL GROUND DECODER |
| SENSE AMPS | | | SENSE AMPS | SENSE AMPS | | SENSE AMPS |

DATA INPUT/OUTPUT

*FIG. 1*

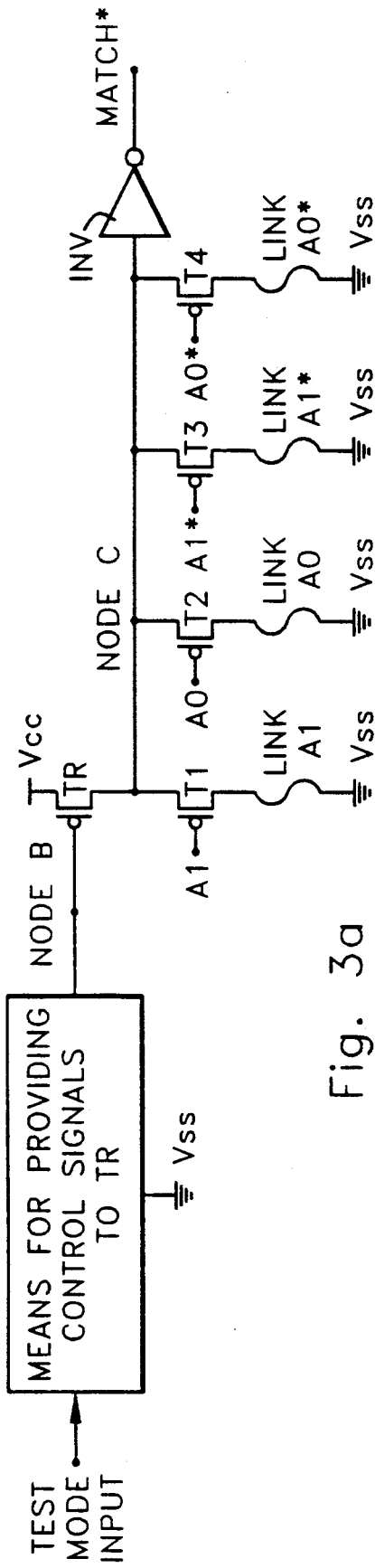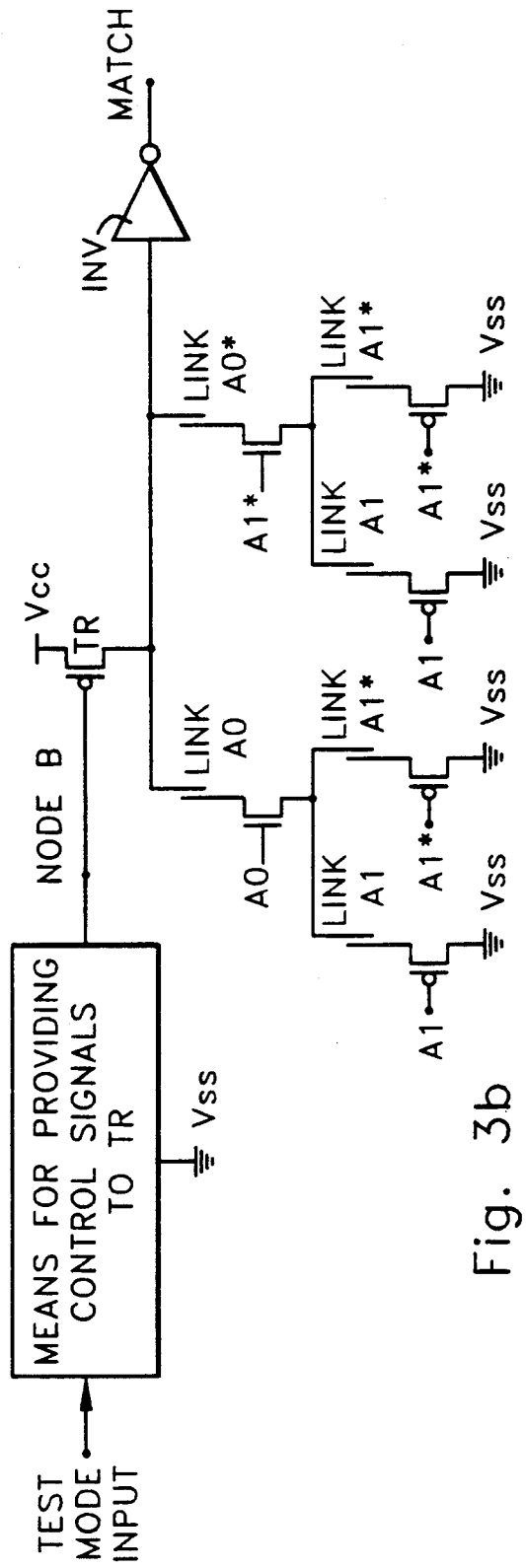
Fig. 3a
Fig. 3b

INTEGRATED CIRCUIT FUSE-LINK TESTER AND TEST METHOD

BACKGROUND OF THE INVENTION

This invention relates to integrated circuits, such as electrically-programmable, read-only-memory (EPROM) arrays, and to a circuit and method for ensuring the quality of fuse-link alterations by laser or other means.

In particular, the invention relates to avoiding or eliminating errors resulting from fuse-links that are not completely opened or closed during alteration.

An EPROM array is but one example of an integrated circuit that in which the circuit and method of this invention may be used. EPROM arrays include floating-gate memory cells arranged in rows and columns. The floating gate of a programmed memory cell is charged with electrons, and the electrons in turn render the source-drain path under the charged floating gate nonconductive when a chosen wordline select voltage is applied to the control gate. The nonconductive state is read as a "zero" bit. The floating gate of a non-programmed cell is neutrally charged such that the source-drain path under the non-programmed floating gate is conductive when the same chosen wordline select voltage is applied to the control gate. The conductive state is read as a "one" bit.

Each column and row of an EPROM array may contain thousands of cells. The sources of each cell in a column are connected to a source-column line. The drains of each cell in a column are connected to a separate bitline (drain-column line). The control gates of each cell in a row are connected to a wordline.

During cell programming, appropriate programming voltages applied to the selected control-gate wordline and drain bitline to create a high-current condition in the selected channel region, injecting channel-hot electrons and/or avalanche-breakdown electrons across the channel oxide to the floating gate.

To improve manufacturing yield, redundant columns and rows of memory cells are used to replace columns or rows with defective memory cells. The integrated memory circuit may include a set of links or fuses that are programmed to provide address information pertaining to the columns or rows with the defective memory cells. Address information in the set of links or fuses is compared with the incoming addresses, and input and output data are routed to the redundant rows or columns.

Chips manufactured with "closed" electrical links as elements to program redundant address data may be programmed by electrically opening selected links with high currents and/or electric fields or may be programmed by using a laser to "explode" the link. Chips that are manufactured with "opened" electrical links between two layers may be programmed by causing the links to form resistive shorts.

For the first case, in which selected "closed" links are "opened" during programming, complete "opens" are not always formed. Marginally opened links can cause incorrect results at different operating conditions or sequences. Typically, these are screened or tested by some complex or some non-standard method. Often, a new screen test will have to be developed for each new device.

There is a need for a circuit and method to test the resistance of the open state and guarantee a high level of safety margin to ensure that the open state will not be misread. A prior-art, basic method for reading redundant data from fuses is the use of a P-channel transistor with source-drain path connected between supply voltage source Vcc and an intermediate node. Individual polysilicon links are connected in series with the source-drain paths of gate devices or transistors. Each series-connected link and gate transistor is connected between the intermediate node and reference potential Vss. The gate of each gate device is connected to an address buffer output. The gate of the P-channel transistor is normally connected to a source of reference potential, which may be ground or Vss. The polysilicon links are low enough in resistance that when only one gate device is conductive, the voltage at the intermediate node will be low enough that, when applied to an inverter, will cause the output of that inverter to be a high voltage. For example, if two of the polysilicon links are opened to program an address, the input to the inverter will be at a low voltage as long as the gate devices in series with the remaining links are conductive. However, when that address is applied at terminals of the gate devices, a "match" occurs, the transistors in series with the remaining links are not conductive, and the voltage at the intermediate node goes to a higher voltage. However, if one of polysilicon links is not opened completely, the voltage at the intermediate node may not go as high as the supply voltage Vcc and may cause the voltage at the output of the inverter to be unstable or may cause an invalid output state.

SUMMARY OF THE INVENTION

The circuit and process of this invention provide for eliminating errors caused by fuses or links that are not completely opened or closed during programming.

In the case of links that are programmed by opening, links that are not completely opened are detected by causing, in response to a test mode signal, the impedance of the P-channel transistor to be larger in magnitude. If the programmed circuit operates properly with the higher impedance condition of the P-channel transistor, then the programmed circuit will function with margin at the nominal impedance of the P-channel transistor.

The test circuit of this invention, in one embodiment, includes a variable impedance, such as a P-channel transistor, connected between a voltage source and an output terminal, the impedance having one value with a first input applied to the variable impedance control terminal and having a second, larger value in response to a second input applied to the variable impedance control terminal. At least one programmable fuse-link and a gate are connected in series between the output terminal and a source of reference potential. A means for providing control inputs to change the variable impedance is connected between a test mode input signal and the control terminal of the variable impedance. The means for providing control inputs to the P-channel transistor type may include a second, current-mirror-connected P-channel transistor.

BRIEF DESCRIPTION OF THE DRAWINGS

The novel features of this invention are set forth in the appended claims. The invention, its features, and its advantages are described below in conjunction with the following drawings:

FIG. 1 is a representation of an integrated circuit layout for a four-megabit it EPROM array.

FIG. 3a is a representation, in partial block form, of a circuit for testing links that are programmed by opening.

FIG. 3b is a representation, in partial block form, of a circuit for testing links that are programmed by shorting.

DETAILED DESCRIPTION OF THE SPECIFIC EMBODIMENT

Referring to FIG. 1, an example of an integrated circuit layout for a nominal four-megabit EPROM is illustrated. The layout, in which dimensional proportions are not those of actual manufacture, illustrates sixteen 512×512 memory sub-arrays with redundant rows and columns used to replace rows and columns having defective cells. Peripheral circuitry, including row decoders, column decoders, virtual-ground decoders, wordline drivers, and column/segment pass gates, all of which function to connecting reading and programming voltages to the rows and columns of cells in response to address inputs routed through a pre-decoder and program path. Data are written into the memory arrays during programming operations. During reading operations, data from the memory arrays are routed through sense amplifiers to the output.

Figure 2:
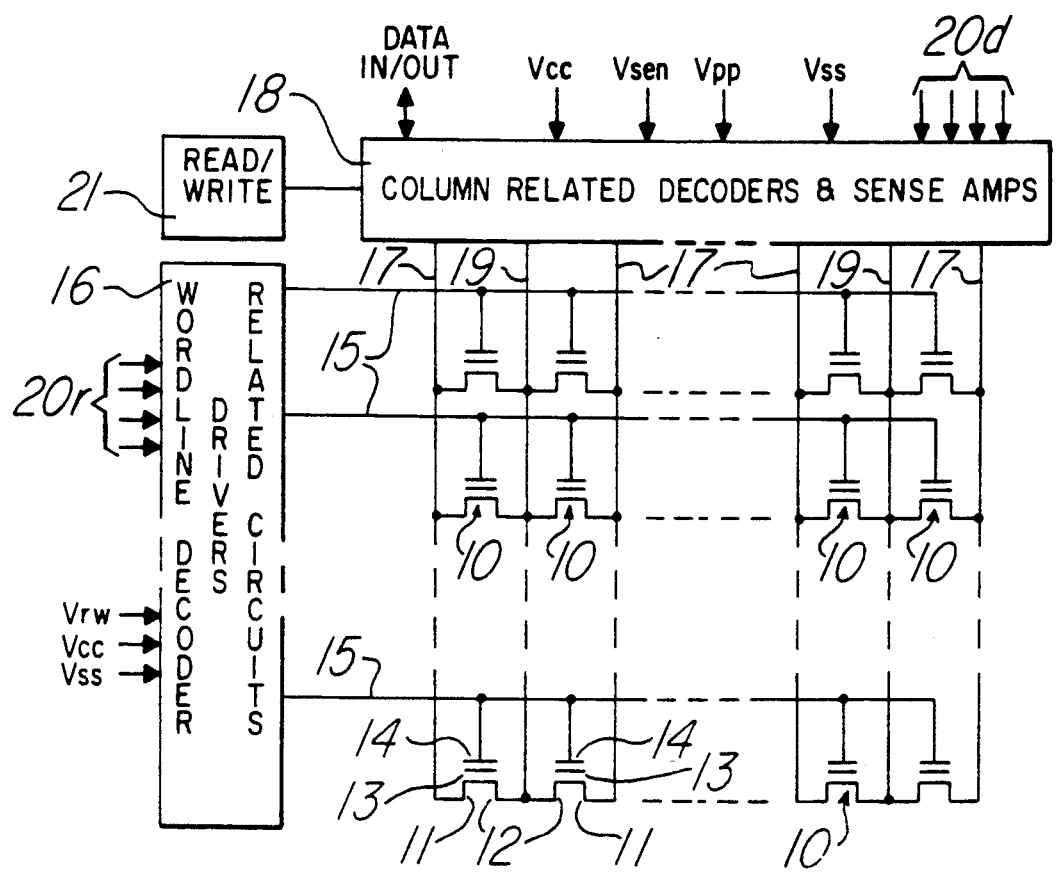
FIG. 2 is a representation of a part of a memory cell array and associated, circuitry of the integrated circuit of FIG. 1.

Referring to FIG. 2, an example array of memory cells, which is a part of a memory chip such as that illustrated in FIG. 1, is shown. Each cell is a floating-gate transistor 10 having a source 11, a drain 12, a floating gate 13 and a control gate 14. Each of the control gates 14 in a row of cells 10 is connected to a wordline 15, and each of the wordlines 15 is connected to a wordline circuit 16, which includes wordline decoders, drivers and related circuitry. Each of the sources 11 in a column of cells 10 is connected to a source-column line 17 (which may be a virtual-ground line), and each of the source-column lines 17 is connected to a column circuit 18, which includes column/segment decoders, virtual ground decoders and column/segment pass gates. Each of the drains 12 in a column of cells 10 is connected to a drain-column line 19, and each of the drain-column lines 19 is connected to the column circuit 18.

In a write or program mode, the wordline circuit 16 may function, in response to wordline address signals on lines 20r and to signals from Read/Write control circuit 21, (or a microprocessor 21) to place a preselected first programming voltage Vpp (approx.+12.5V) on a selected wordline 15, including a selected control-gate conductor 14. Column circuit 18 also functions to place a second programming voltage Vrw (Vpp reduced through an impedance to approx.+5 to+10V) on a selected source-column line 17 and, therefore, the source region 11 of selected cell 10. The selected drain-column line 19 is connected to reference potential Vss. Deselected source-column lines 17 and deselected drain-column lines 19 are floated. These programming voltages create a high current (drain 12 to source 11) condition in the channel of the selected memory cell 10, resulting in the generation near the drain-channel junction of channel-hot electrons and avalanche-breakdown electrons that are injected across the channel oxide to the floating gate 13 of the selected cell 10. The programming time is selected to be sufficiently long to program the floating gate 13 with a negative program charge of approximately −2V to −6V with respect to the channel region. The injected electrons and negative voltage in turn render the source-drain path under the floating gate 13 of the selected cell 10 nonconductive, a state which is read as a "zero" bit. Deselected cells 10 have source-drain paths under the floating gate 13 that remain conductive, and those cells 10 are read as "one" bits.

Erasing of cells may be accomplished, for example, by ultraviolet radiation.

In the read mode, the wordline circuit 16 functions, in response to wordline address signals on lines 20r and to a signal from Read/Write control circuit 21, to apply a preselected positive voltage Vcc (approx.+3 to+5 volts) to the selected wordline 15 (and the selected control gate 14), and to apply a low voltage (ground or Vss) to deselected wordlines 15. The column circuit 18 functions, in response to column address signals on lines 20d, causes a sense amplifier to apply a preselected positive voltage Vsen (approx.+1 to+1.5 volts) to the selected drain-column line 19. The column circuit 18 also functions to connect all of the source-column lines 17 to ground (or Vss) except for the source-column line 17 sharing the same drain-column line connected to the cell 10 that is being read. That source-column line 17 is driven to the same voltage level as the selected drain-column line. The conductive or nonconductive state of the cell 10 connected to the selected drain-column line 19 and the selected wordline 15 is detected by a sense amplifier connected to the DATA OUT terminal.

As is well-known, the source 11 regions and the drain 12 regions of the memory cells 10 may be interchanged for the various modes of operation. Voltages applied to the source 11 and drain 12 regions in the read example above are interchangeable. Therefore, the terms "source" and "drain" as used herein are interchangeable for each mode of operation.

To improve manufacturing yield, redundant columns and rows of memory cells are used to replace columns or rows with defective memory cells. The integrated memory circuit may include a set of links or fuses that are programmed to provide address information pertaining to the columns or rows with the defective memory cells. Address information in the set of links or fuses is compared with the incoming addresses, and input and output data are routed to the redundant rows or columns.

Chips manufactured with "closed" electrical links as elements to program redundant address data may be programmed by electrically opening selected links with high currents and/or electric fields or may be programmed by using a laser to "explode" the link. Chips that are manufactured with "opened" electrical links between two layers may be programmed causing the links to form resistive shorts.

For the first case, in which selected "closed" links are "opened" during programming, complete "opens" are not always formed. Marginally opened links can cause incorrect results at different operating conditions or sequences.

Figure 4A:
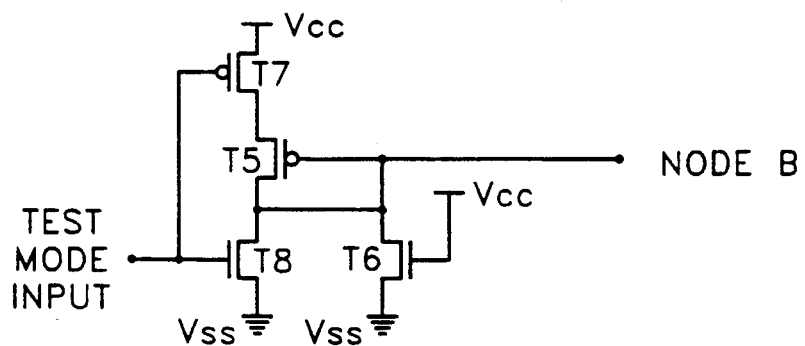
FIGS. 4a–b circuits for use in providing control signals for controlling the impedance of a P-channel transistor such as that used in the circuits of FIGS. 3a–b.
Figure 4B:
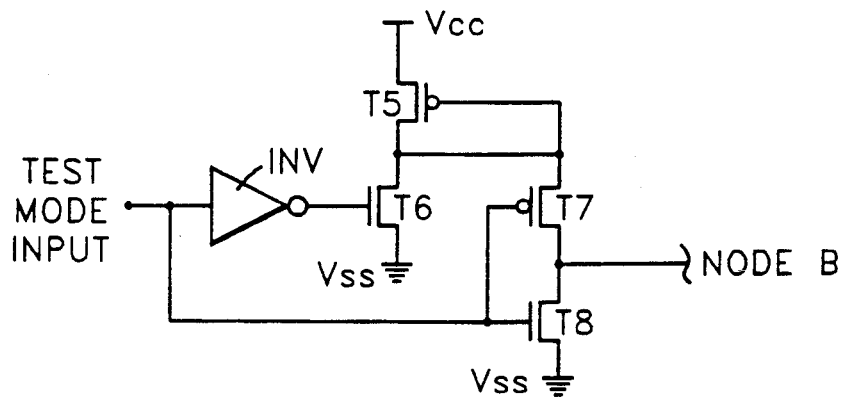

A circuit to test the quality of the open state and to ensure a high level of safety margin against misreading is illustrated in FIGS. 3a and 4a–b. Referring now to FIG. 3a, a basic circuit for reading addresses of redundant columns or rows, for example, using opened links is illustrated.

Transistor TR is a resistive-impedance P-channel device. Fuse A0, Fuse A1, Fuse A0* and Fuse A1* are polysilicon links and are low enough in resistance that when only one gate device (T1, T2, T3 or T4) is conductive, the voltage at output NODE C will be low enough to force the Match* terminal at the output of INV to a high voltage. (The asterisk indicates opposite state.) To make the Match* output terminal go to a low voltage, two links are opened to program an address. When that address is applied at terminals A0, A1, A0* and A1*; a "match" occurs and output NODE C goes high. Assume, for example, that Fuse A1 and Fuse A0* are opened (Fuse A1* and Fuse A0 are closed). When address A1,A0=1,0 (A1*,A0* =0,1) is applied to the gates of the gate devices T1-4, a match occurs. However, if one or the other of Fuses A1 or A0* is not opened completely, the voltage at output NODE C will not rise all the way to Vcc. In fact, if either of Fuses A1 or A0* has a low enough "open" resistance, output NODE C will reach a meta-stable state, or a completely invalid state.

The meta-stable states, or invalid states, may be screened by utilizing a test circuit that causes the impedance of TR to be more resistive during a test mode of operation. If, during the test mode, the "open" passes the higher resistance condition of TR, the "open" will function properly during normal operation. The test circuit should preferably be on-chip, should be activated by a TEST MODE INPUT signal applied to one or more of the terminals of the chip, and should have a means for signalling the success or failure of the test. Example circuits for providing control signals to transistor TR and, thereby, implementing the change in impedance of transistor TR are shown in FIGS. 4a–b. A circuit and method for signalling the success or failure of the test (indicating the output of the Match* terminal) is described in co-pending U.S. patent application Ser. No. 07/574,823, filed Aug. 30, 1990.

Referring now to FIG. 4a, a second P-channel transistor T5 has a gate connected to the gate (NODE B) of first P-channel transistor TR. The source-drain path of second P-channel transistor T5 is connected in series with optional transistor T7 between the voltage source input Vcc and the gate of first P-channel transistor TR of FIG. 3a. A N-channel load transistor T6 has a gate connected to the voltage source Vcc. The source-drain path of load transistor T6 is connected between the gate of first P-channel transistor TR and reference potential input Vss. First N-channel enabling transistor T8 has a gate connected to the TEST MODE INPUT signal. The source-drain path of the first enabling transistor T8 is connected between the gate of first P-channel transistor TR and reference potential Vss. Optional second P-channel enabling transistor T7 has a gate connected to the TEST MODE INPUT signal. The source-drain path of second enabling transistor T7 is connected in series with the source-drain path of the second P-channel transistor T5.

Referring again to FIG. 4a as applied to open-circuit testing, the TEST MODE INPUT signal is low during test mode operation, and the circuit functions to provide control signals that increase and decrease the impedance of P-channel transistor TR of FIG. 3a. Load transistor T6 is a fairly high impedance device. If variable impedance transistor T5 in FIG. 4a is a similar or same size and type as transistor TR in FIG. 3a, the circuit of FIGS. 4a feeding the circuit in FIG. 3a acts as a current mirror in which the impedance of transistor TR changes with input to transistor T5. Transistor T7 is non-conductive and transistor T8 is conductive with the TEST MODE INPUT signal high, effectively disconnecting the means circuit and connecting NODE B to reference potential Vss. With the TEST MODE INPUT signal low, transistor T7 is conductive and transistor T8 is non-conductive, connecting transistors T5 and TR in current-mirror form.

The TEST MODE INPUT signal may be derived by logic circuitry from one or more signals applied to the chip terminals.

Referring now to FIG. 4b, second P-channel transistor T5 has a gate connected through optional transistor T7 to the gate (NODE B) of first P-channel transistor TR. The source-drain path of second P-channel transistor T5 is connected in series with the source-drain path of optional transistor T7 between the voltage source input Vcc and the gate of first P-channel transistor TR. N-channel load transistor T6 has a gate connected to the TEST MODE INPUT signal through an inverter INV. The source-drain path of load transistor T6 is connected through optional transistor T7 between the gate of first P-channel transistor TR and the reference potential input Vss. First enabling transistor T8 has a gate connected to the TEST MODE INPUT signal. The source-drain path of the first enabling transistor T8 is connected between the gate of the first P-channel transistor TR and reference potential input Vss. Second enabling transistor T7 has a gate connected to the TEST MODE INPUT signal. The source-drain path of the second enabling transistor T7 is connected between the gate of first P-channel transistor TR and the gate of second P-channel transistor T5.

Referring again to FIG. 4b as applied to open-circuit testing, the TEST MODE INPUT signal is low during test mode operation, and the circuit also functions to provide control signals that increase and decrease the impedance of P-channel transistor TR of FIG. 3a. Load transistor T6 is a fairly high impedance device. If variable impedance transistor T5 in FIG. 4b is a similar or same size and type as transistor TR in FIG. 3a, the circuit of FIG. 4b feeding the circuit in FIG. 3a acts as a current mirror in which the impedance of transistor TR changes with input to transistor T5. Inverter INV causes transistor T6 to conduct during test mode operations. Transistor T7 is non-conductive and transistor T8 is conductive with the TEST MODE INPUT signal high, effectively disconnecting the means circuit and connecting NODE B to reference potential or Vss. However, with the TEST MODE INPUT signal low, transistor T7 is conductive and transistor T8 is non-conductive, connecting transistors T5 and TR in current-mirror form.

A circuit in which shorts are formed between two layers is illustrated in FIG. 3b. The P-channel transistor TR of FIG. 3b should have reduced impedance during special test mode. The circuits of FIGS. 4a–b may be used with the circuit of FIG. 3b; however, the TEST MODE INPUT signal should be high during test mode operation and low during other operations.

The circuits and methods of this invention may be adapted for dynamic fuse reading circuits.

The means for programming FIG. 3a and FIG. 3b are not illustrated. The links of FIG. 3a can, for example, be programmed with lasers.

While this invention has been described with respect to an illustrative embodiment, this description is not intended to be construed in a limiting sense. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

We claim:

1. A test circuit, comprising:
a voltage source input;
a reference potential input;
a test mode signal input;
at least one address signal input;
an output node;
a variable impedance having first, second and third terminals, the impedance between said first and second terminals having at least one value in response to a first control input applied to said third terminal and having at least a second value in response to a second control input applied to said third terminal, said first terminal connected to said voltage source input, said second terminal connected to said output node;
at least one programmable fuse-link having first and second terminals;
at least one gate device having first, second and third terminals, said gate device being conductive and non-conductive between said first and second terminals in response to said address signal input applied to said third terminal, said first terminal of said gate device connected to said first terminal of said fuse-link;
said second terminal of said programmable fuse-link connected to one of said reference potential input and said output node and said second terminal of said gate device connected to the other of said reference voltage input and said output node; and
means for providing said first and second control inputs to said third terminal of said variable impedance, said means having at least first and second terminals, said first terminal of said means connected to said third terminal of said variable impedance, said second terminal of said means connected to said test mode signal input.

2. The test circuit of claim 1, wherein said variable impedance is a P-channel transistor.

3. The test circuit of claim 1, wherein said variable impedance is a first P-channel transistor having a gate, wherein said gate of said first P-channel transistor is said third terminal of said variable impedance, and wherein said means for providing said first and second control inputs comprises:
a second P-channel transistor having a source-drain path and a gate, said gate of said second P-channel transistor connected to said gate of said first P-channel transistor, said source-drain path of said second P-channel transistor connected between said voltage source input and said gate of said first P-channel transistor;
a N-channel load transistor having a source-drain path and a gate, said gate of said load transistor connected to said voltage source input, said source-drain path of said load transistor connected between said gate of said first P-channel transistor and said reference potential input; and
a first enabling transistor having a gate and a source-drain path, said gate of said first enabling transistor connected to said test mode signal input, said source-drain path of said first enabling transistor connected between said gate of said first P-channel transistor and said reference potential input.

4. The test circuit of claim 1, wherein said variable impedance is a first P-channel transistor having a gate, wherein said gate of said first P-channel transistor is said third terminal of said variable impedance, and wherein said means for providing said first and second control inputs comprises:
a second P-channel transistor having a source-drain path and a gate, said gate of said second P-channel transistor connected to said gate of said first P-channel transistor, said source-drain path of said second P-channel transistor connected between said voltage source input and said gate of said first P-channel transistor;
a N-channel load transistor having a source-drain path and a gate, said gate of said load transistor connected to said voltage source, said source-drain path of said load transistor connected between said gate of said first P-channel transistor and said reference potential input;
a first enabling transistor having a gate and a source-drain path, said gate of said first enabling transistor connected to said test mode signal input, said source-drain path of said first enabling transistor connected between said gate of said first P-channel transistor and said reference potential input; and
a second enabling transistor having a gate and a source-drain path, said gate of said second enabling transistor connected to said test mode signal input, said source-drain path of said second enabling transistor connected in series with said source-drain path of said second P-channel transistor.

5. The test circuit of claim 1, wherein said variable impedance is a first P-channel transistor having a gate, wherein said gate of said first P-channel transistor is said third terminal of said variable impedance, and wherein said means for providing said first and second control inputs comprises:
a second P-channel transistor having a source-drain path and a gate, said gate of said second P-channel transistor connected to said gate of said first P-channel transistor, said source-drain path of said second P-channel transistor connected between said voltage source input and said gate of said first P-channel transistor;
a N-channel load transistor having a source-drain path and a gate, said gate of said load transistor connected to said test mode signal input through an inverter, said source-drain path of said load transistor connected between said gate of said first P-channel transistor and said reference potential input;
a first enabling transistor having a gate and a source-drain path, said gate of said first enabling transistor connected to said test mode signal input, said source-drain path of said first enabling transistor connected between said gate of said first P-channel transistor and said reference potential input.

6. The test circuit of claim 1, wherein said variable impedance is a first P-channel transistor having a gate, wherein said gate of said first P-channel transistor is said third terminal of said variable impedance, and wherein said means for providing said first and second control inputs comprises:
- a second P-channel transistor having a source-drain path and a gate, said gate of said second P-channel transistor connected to said gate of said first P-channel transistor, said source-drain path of said second P-channel transistor connected between said voltage source input and said gate of said first P-channel transistor;
- a N-channel load transistor having a source-drain path and a gate, said gate of said load transistor connected to said test mode signal input through an inverter, said source-drain path of said load transistor connected between said gate of said first P-channel transistor and said reference potential input;
- a first enabling transistor having a gate and a source-drain path, said gate of said first enabling transistor connected to said test mode signal input, said source-drain path of said first enabling transistor connected between said gate of said first P-channel transistor and said reference potential input; and
- a second enabling transistor having a gate and a source-drain path, said gate of said second enabling transistor connected to said test mode signal input, said source-drain path of said second enabling transistor connected between said gate of said first P-channel transistor and said gate of said second P-channel transistor.

7. A test circuit, comprising:
- a voltage source input;
- a reference potential input;
- a test mode signal input;
- at least one address signal input;
- an output node;
- a variable impedance having first, second and third terminals, the impedance between said first and second terminals having at least one value in response to a first control input applied to said third terminal and having at least a second value in response to a second control input applied to said third terminal, said first terminal connected to said voltage source input, said second terminal connected to said output node;
- at least one programmable fuse-link having first and second terminals;
- at least one gate device having first, second and third terminals, said gate device being conductive and non-conductive between said first and second terminals in response to said address signal applied to said third terminal, said first terminal of said gate device connected to said first terminal of said fuse-link;
- said second terminal of said programmable fuse-link connected to said output node and said second terminal of said gate device connected to said reference potential input; and
- means for providing said first and second control inputs to said third terminal of said variable impedance, said means having at least first and second terminals, said first terminal of said means connected to said third terminal of said variable impedance, said second terminal of said means connected to said test mode signal input.

8. The test circuit of claim 7, wherein said variable impedance is a P-channel transistor.

9. The test circuit of claim 7, wherein said variable impedance is a first P-channel transistor having a gate, wherein said gate of said first P-channel transistor is said third terminal of said variable impedance, and wherein said means for providing said first and second control inputs comprises:
- a second P-channel transistor having a source-drain path and a gate, said gate of said second P-channel transistor connected to said gate of said first P-channel transistor, said source-drain path of said second P-channel transistor connected between said voltage source input and said gate of said first P-channel transistor;
- a N-channel load transistor having a source-drain path and a gate, said gate of said load transistor connected to said voltage source input, said source-drain path of said load transistor connected between said gate of said first P-channel transistor and said reference potential input; and
- a first enabling transistor having a gate and a source-drain path, said gate of said first enabling transistor connected to said test mode signal input, said source-drain path of said first enabling transistor connected between said gate of said first P-channel transistor and said reference potential input.

10. The test circuit of claim 7, wherein said variable impedance is a first P-channel transistor having a gate, wherein said gate of said first P-channel transistor is said third terminal of said variable impedance, and wherein said means for providing said first and second control inputs comprises:
- a second P-channel transistor having a source-drain path and a gate, said gate of said second P-channel transistor connected to said gate of said first P-channel transistor, said source-drain path of said second P-channel transistor connected between said voltage source input and said gate of said first P-channel transistor;
- a N-channel load transistor having a source-drain path and a gate, said gate of said load transistor connected to said voltage source, said source-drain path of said load transistor connected between said gate of said first P-channel transistor and said reference potential input;
- a first enabling transistor having a gate and a source-drain path, said gate of said first enabling transistor connected to said test mode signal input, said source-drain path of said first enabling transistor connected between said gate of said first P-channel transistor and said reference potential input; and
- a second enabling transistor having a gate and a source-drain path, said gate of said second enabling transistor connected to said test mode signal input, said source-drain path of said second enabling transistor connected in series with said source-drain path of said second P-channel transistor.

11. The test circuit of claim 7, wherein said variable impedance is a first P-channel transistor having a gate, wherein said gate of said first P-channel transistor is said third terminal of said variable impedance, and wherein said means for providing said first and second control inputs comprises:
- a second P-channel transistor having a source-drain path and a gate, said gate of said second P-channel transistor connected to said gate of said first P-channel transistor, said source-drain path of said second P-channel transistor connected between said voltage source input and said gate of said first P-channel transistor;

a N-channel load transistor having a source-drain path and a gate, said gate of said load transistor connected to said test mode signal input through an inverter, said source-drain path of said load transistor connected between said gate of said first P-channel transistor and said reference potential input;

a first enabling transistor having a gate and a source-drain path, said gate of said first enabling transistor connected to said test mode signal input's aid source-drain path of said first enabling transistor connected between said gate of said first P-channel transistor and said reference potential input.

12. The test circuit of claim 7, wherein said variable impedance is a first P-channel transistor having a gate, wherein said gate of said first P-channel transistor is said third terminal of said variable impedance, and wherein said means for providing said first and second control inputs comprises:

a second P-channel transistor having a source-drain path and a gate, said gate of said second P-channel transistor connected to said gate of said first P-channel transistor, said source-drain path of said second P-channel transistor connected between said voltage source input and said gate of said first P-channel transistor;

a N-channel load transistor having a source-drain path and a gate, said gate of said load transistor connected to said test mode signal input through an inverter, said source-drain path of said load transistor connected between said gate of said first P-channel transistor and said reference potential input;

a first enabling transistor having a gate and a source-drain path, said gate of said first enabling transistor connected to said test mode signal input, said source-drain path of said first enabling transistor connected between said gate of said first P-channel transistor and said reference potential input; and a second enabling transistor having a gate and a source-drain path, said gate of said second enabling transistor connected to said test mode signal input, said source-drain path of said second enabling transistor connected between said gate of said first P-channel transistor and said gate of said second P-channel transistor.

13. A method for ensuring the quality of fuse-link programming, wherein at least one fuse-link is connected in series with a gate device, wherein said series-connected fuse-link and said gate device are connected between an output node and a reference potential, and wherein a variable impedance is connected between a voltage source and said output node, the method comprising:

increasing the impedance of said variable impedance in response to a test mode signal;

causing said gate device to be non-conductive in response to an address signal; and sensing the voltage at said output node to determine said quality of said fuse-link programming.

14. The method of claim 13, wherein said variable impedance is a P-channel transistor.

15. A method for ensuring the quality of fuse-link programming, wherein at least one programmed fuse-link is connected in parallel with a gate device, wherein said parallel-connected fuse-link and gate device are connected to an output node, and wherein a variable impedance is connected between a voltage source and said output node, the method comprising:

increasing the impedance of said variable impedance in response to a test mode signal;

causing said gate device to be non-conductive in response to an address signal; and sensing the voltage at said output node to determine said quality of said fuse link processing.

16. The method of claim 15, wherein said variable impedance is a P-channel transistor.

* * * * *